United States Patent
Naoe et al.

(10) Patent No.: US 8,280,147 B2
(45) Date of Patent: Oct. 2, 2012

(54) PATTERN VERIFICATION METHOD, PATTERN VERIFICATION APPARATUS, AND PATTERN VERIFICATION PROGRAM

(75) Inventors: Mitsufumi Naoe, Kasugai (JP); Toru Miyauchi, Kasugai (JP); Tomoyuki Okada, Yokohama (JP); Seiji Makino, Yokohama (JP); Koichi Suzuki, Yokohama (JP); Masakazu Ohseki, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 465 days.

(21) Appl. No.: 12/700,820

(22) Filed: Feb. 5, 2010

(65) Prior Publication Data

US 2010/0232679 A1 Sep. 16, 2010

(30) Foreign Application Priority Data

Mar. 16, 2009 (JP) .................... 2009-63322

(51) Int. Cl.
*G06K 9/00* (2006.01)
(52) U.S. Cl. ....................................... 382/144
(58) Field of Classification Search .......... 382/144–151, 382/181; 356/237.4, 237.5; 250/559.39–559.49; 702/40, 82
See application file for complete search history.

(56) References Cited

U.S. PATENT DOCUMENTS

2009/0123058 A1* 5/2009 Ito .................................. 382/144

FOREIGN PATENT DOCUMENTS

JP 2007-266391 A 10/2007

* cited by examiner

*Primary Examiner* — Tarifur Chowdhury
*Assistant Examiner* — Abdullahi Nur
(74) *Attorney, Agent, or Firm* — Westerman, Hattori, Daniels & Adrian, LLP (57) ABSTRACT

A pattern verification apparatus includes a correction section creating a plurality of first data pieces; a determination section performing light intensity simulation to create a plurality of plots, determine whether or not each of the plurality of simulation result plots falls within an allowable range, and recognize two or more simulation result plots which do not fall within the allowable range as a plurality of second data pieces; an extraction section extracting a reference pattern of the plurality of original design patterns corresponding to the plurality of second data pieces; and a classifying section classifying the plurality of second data pieces into categories of the reference pattern.

19 Claims, 10 Drawing Sheets

PATTERN VERIFICATION METHOD, PATTERN VERIFICATION APPARATUS, AND PATTERN VERIFICATION PROGRAM

CROSS REFERENCE TO RELATED APPLICATIONS

This application is based upon and claims the benefit of priority from the prior Japanese Patent Application No. 2009-63322, filed on Mar. 16, 2009, the entire contents of which is incorporated herein by reference.

FIELD

The present invention relates to verifying patterns of electronic devices.

BACKGROUND

In recent years, technologies for fabricating electronic devices such as semiconductor devices having device patterns with high degrees of miniaturization and integration have been further advanced. With the increased degrees of miniaturization and integration of device patterns, criteria for verifying pattern placement in device manufacturing have become more stringent. In order to improve dimensional precision of device patterns, optical proximity correction (OPC) techniques have been developed. OPC is a correction technique in which an edge of an original design layout pattern is moved so that a device pattern having desired dimensions may be formed on a substrate.

In pattern verification in general, patterns in an original design layout are corrected by OPC so that pattern data is obtained. Then, contour plots are created by lithography simulation using the pattern data, and defects included in the contour plots are verified. The contour plots with defects detected by a lithography simulator (hereinafter referred to as "defective contour plots") are sorted in accordance with the types of defects, using pattern matching for example. Then, pattern verification is performed on the defective contour plots.

Along with the increases in degrees of miniaturization and integration of device patterns, there are more cases where OPC-processed patterns have complex shapes. As a result, the matching ratio in pattern matching in classifying of defective contour plots decreases, and consequently, precise pattern verification requires a significant number of processes and a significant length of time.

SUMMARY

According to an aspect of the invention, a pattern verification apparatus includes a correction section creating a plurality of first data pieces; a determination section performing light intensity simulation to create a plurality of plots, determine whether or not each of the plurality of simulation result plots falls within an allowable range, and recognize two or more simulation result plots which do not fall within the allowable range as a plurality of second data pieces; an extraction section extracting a reference pattern of the plurality of original design patterns corresponding to the plurality of second data pieces; and a classifying section classifying the plurality of second data pieces into categories of the reference pattern.

An object and advantages of an embodiment of the invention will be realized and attained by elements and combinations of elements particularly pointed out in the claims.

It is to be understood that both the foregoing general description and the following detailed description are explanatory and are not restrictive of the invention, as claimed.

DESCRIPTION OF EMBODIMENTS

In the present embodiment, lithography simulation results, for example defective contour plots, are used as classifying reference patterns when conducting classifying.

For example, by detecting defective contour plots with a lithography simulator, simulation result plots representing results of a light intensity simulation are detected. When defective contour plots are classified, original design patterns corresponding to the individual defective contour plots, or pattern data cells which have been pre-biased before OPC, are used. Specifically, reference patterns of original design patterns corresponding to the defective contour plots, or regions having a similar shape, are extracted. Thus, a large number of defective contour plots may be classified into categories of reference patterns of the original design patterns. This significantly improves the classifying ratio and realizes simple, precise, and rapid pattern verification of defective contour plots. Pattern data which has been pre-biased as mentioned above will be described below.

In the present embodiment, the defective contour plots which have been classified based on the original design layout at an origin defined at a certain portion of the corresponding reference pattern. Then, it is determined whether or not each of the defective contour plots is acceptable according to an allowable range defined with respect to the reference pattern as the determination criterion. For example, a pair of reference lines are defined with respect to a contour line of the reference pattern. Then, it is determined whether or not the contour line of each of the defective contour plots falls within the allowable range defined by the reference lines, so that the acceptability or unacceptability of each of the defective contour plots is determined. The pair of reference lines may not be the same distance from the contour line of the reference pattern and may be defined so that either of the reference lines is closer to or farther from the contour line of the reference pattern. By setting the allowable range in this way, pattern verification may be performed for each type of reference pattern or each type of defect.

If verification focuses on a defect in a device pattern such as partial disconnection, e.g., necking, or partial adhesion, e.g., bridging, a difference between superposed defective contour plots is calculated. The difference to be calculated may be a difference in the contour line between superposed defective contour plots. In this processing, when necking is focused upon, the defective contour plots having small values are checked. When bridging is focused upon, the defective contour plots having large values are checked. By specifically focusing on a certain defect such as necking or bridging, rapid verification of the acceptability of each of the defective contour plots included in a category of the reference patterns may be realized.

The calculation of a difference between the superposed defective contour plots makes it possible to detect a distribution of defective contour plots corresponding to the reference pattern. As a result, additional information such as a trend of defect formation may also be obtained. By adding the trend of defect formation to the determination criteria utilizing the reference pattern, an absolute distribution of defects formed on defective contour plots may be obtained, and a relative distribution provided with information based on a relation with the reference pattern serving as the determination criteria may be obtained. For example, information as to whether the allowable range is included in the distribution and further information on the location of the allowable range in the distribution may be obtained.

Figure 1:
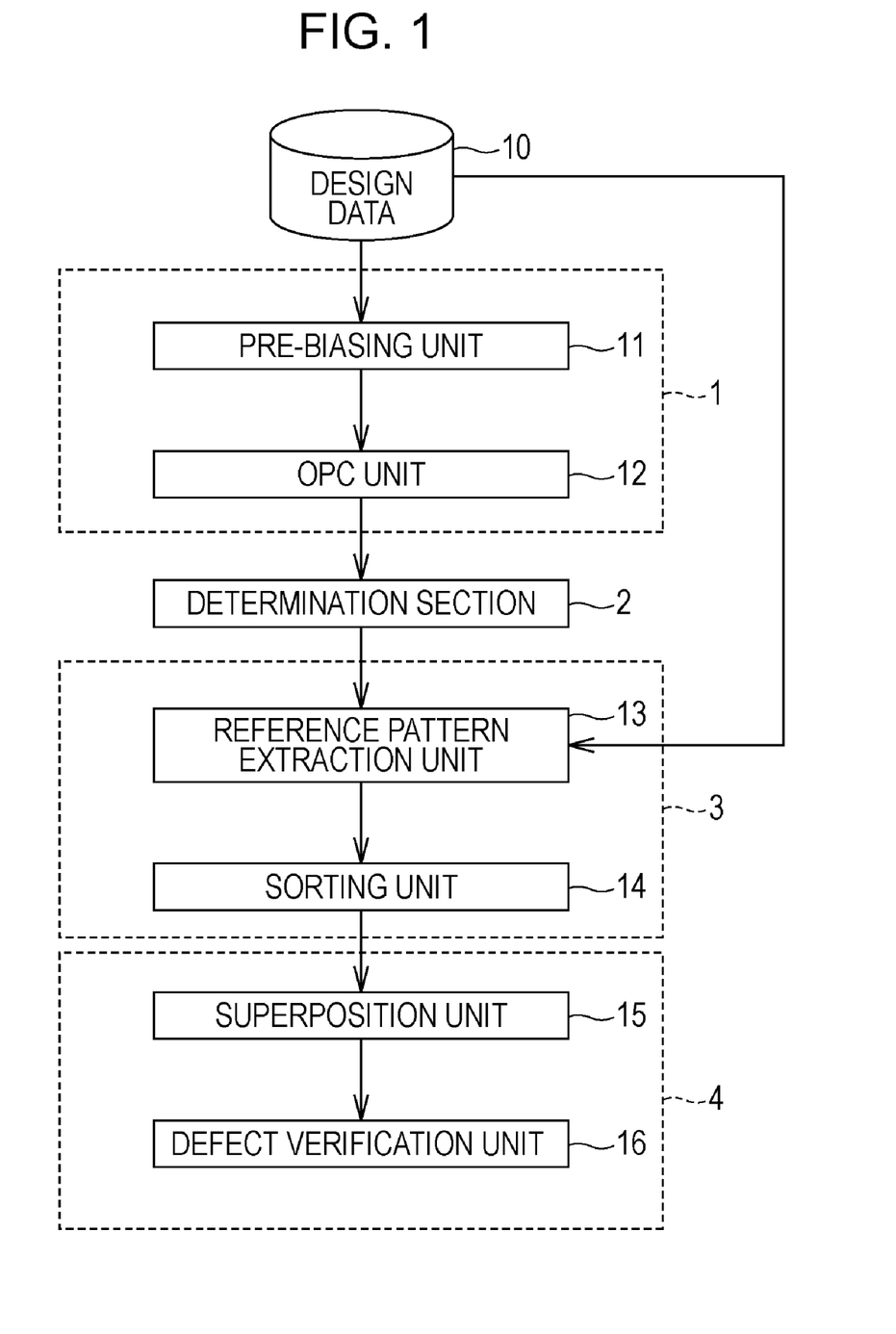
FIG. 1 is a block diagram illustrating a pattern verification apparatus according to an embodiment.
Figure 2:
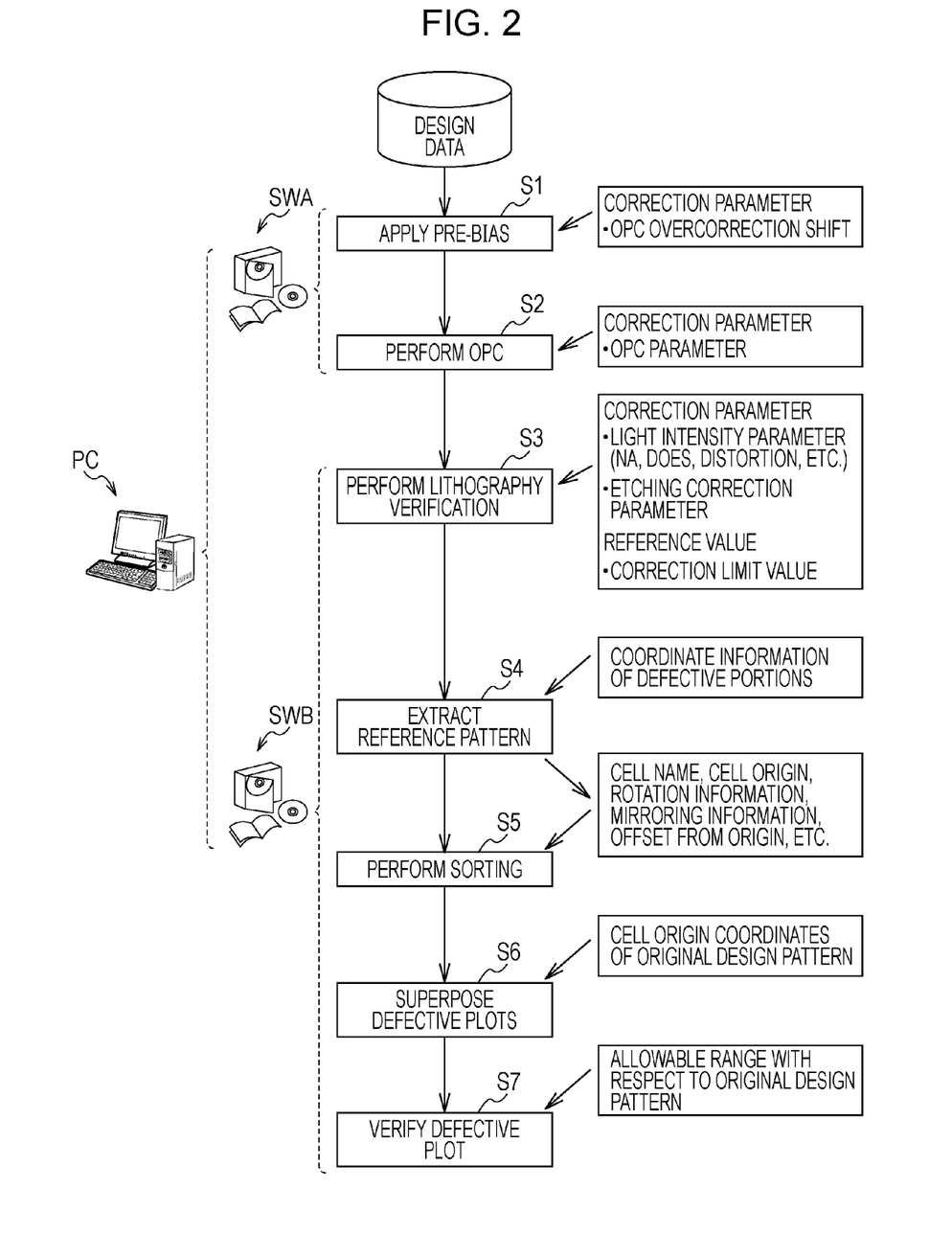
FIG. 2 is a flowchart illustrating a pattern verification method according to an embodiment.

FIG. 1 illustrates a pattern verification apparatus according to an embodiment. FIG. 2 is a flowchart illustrating a procedure of a pattern verification method according to an embodiment.

The pattern verification apparatus performs data-based verification of a device pattern formed by lithography. As illustrated in FIG. 1, the pattern verification apparatus includes a correction section 1, a determination section 2, a classifying section 3, and a superposition determination section 4. The correction section 1 corrects a pattern of an original design of a device to create pattern data. The determination section 2 determines whether or not the dimensions of a contour plot fall within an allowable range. If the dimensions of the contour plot fall out of the allowable range, the determination section 2 recognizes the contour plot as a defective contour plot. The classifying section 3 extracts a reference pattern of an original design pattern corresponding to the defective contour plots and classifies the defective contour plots into categories of the reference patterns. The superposition determination section 4 superposes the defective contour plots on the corresponding reference pattern so that an origin defined at a certain portion on the reference pattern and a corresponding point on a defective contour plot coincide. Then, the superposition determination section 4 determines whether or not each of the defective contour plots is acceptable.

The correction section 1 has a pre-biasing unit 11 for applying a pre-bias to an original design pattern of a device, and an OPC (optical proximity correction) unit 12 for performing OPC on the pre-biased pattern data.

In rule-based OPC, depending on the location of pattern data, a correction result may not have an intended shape. Thus, a pattern shape to be obtained as a result of OPC is predicted in advance and the shape of the pattern data is corrected by pre-biasing before OPC is actually performed. Pre-biasing is a technique of performing reverse correction on a pattern to prevent an error of the pattern data due to excessive optical proximity correction.

The determination section 2, serving as a lithography simulator, predicts a device pattern to be actually formed based on the pattern data by performing simulation, and creates a contour plot. The determination section 2 determines whether or not the dimensions of the created contour plot are within an allowable range. If the dimensions are determined to be out of the allowable range, the determination section 2 recognizes the contour plot as a defective contour plot.

The classifying section 3 has a reference pattern extraction unit 13 for extracting a reference pattern of the original design pattern corresponding to the defective contour plots recognized by the determination section 2. The classifying section 3 also has a classifying unit 14 for classifying the defective contour plots into categories of extracted reference patterns.

The superposition determination section 4 has a superposing unit 15 and a defect verifying unit 16. The superposing unit 15 superposes defective contour plots on a corresponding reference pattern serving as a determination criterion at the origin defined at a certain portion on the reference pattern. The defect verifying unit 16 compares the defective contour plots to the corresponding reference pattern and determines whether or not the defective contour plots are acceptable based on the allowable range. The defect verification unit 16 may also calculate the differences between the defective contour plots and the reference pattern to determine the acceptability or unacceptability of each of the defective contour plots. At this time, the defect verification unit 16 may also create a distribution diagram of defective contour plots with respect to the reference pattern.

In the following, referring to FIG. 2 to FIG. 9B, procedures of a verification method, which are performed using the pattern verification apparatus configured as described above, will be described.

At Step S1, the pre-biasing unit 11 reads original design patterns of device patterns stored in a design data storage section 10, and applies a pre-bias to the original design patterns to create first correction data. In this pre-biasing operation, a correction parameter, such as an OPC overcorrection shift, is used.

Figure 3A:
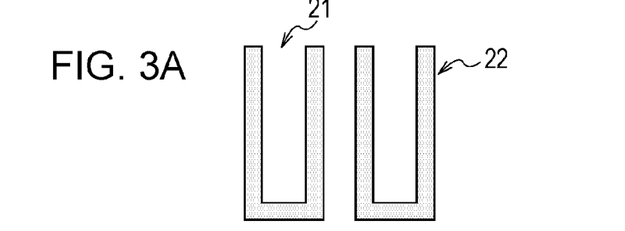
FIGS. 3A to 3D are schematic views illustrating patterns.
Figure 3B:
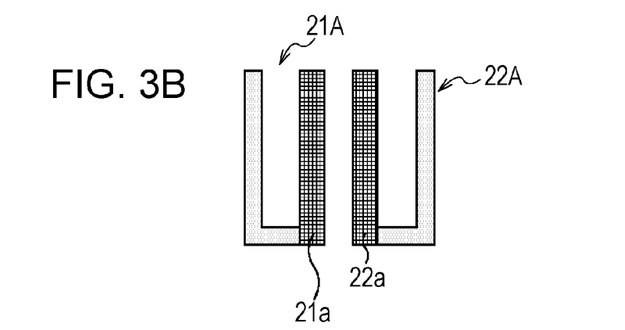

FIG. 3A illustrates original design patterns 21 and 22, which are managed by using the same cell name, as examples of original design patterns. FIG. 3B illustrates first correction data 21A and 22A which are obtained as a result of pre-biasing the original design patterns 21 and 22. In the first correction data 21A and 22B, portions which have been pre-biased are referred to as pre-biased correction portions 21*a* and 22*a*. In this case, the pre-biased correction portions 21*a* and 22*a* are different. Thus, in the pre-biasing stage, the first correction data 21A and the first correction data 22A have different shapes.

At Step S2, the OPC unit 12 performs OPC on the first correction data to create second correction data. In OPC, a correction parameter such as an OPC parameter is used.

Figure 3C:
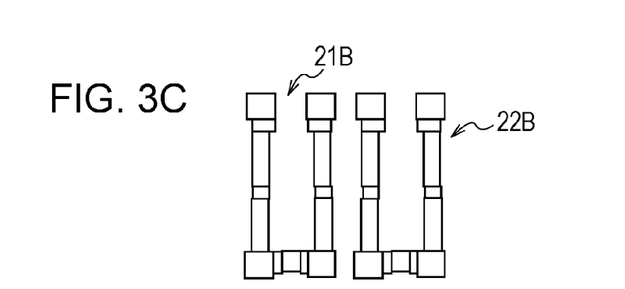

FIG. 3C illustrates second correction data 21B and 22B which are obtained as a result of OPC performed on the first correction data 21A and 22A, respectively. As a result of OPC, individual portions of the second correction data 21B and 22B exhibit fine, uneven shapes which may be different from each other.

At Step S3, the determination section 2 performs lithography verification on the second correction data. In lithography verification, device patterns to be actually formed based on pattern data are predicted by simulation, and contour plots are created. The determination section 2 performs defect determination based on the created contour plots. A contour plot which has been determined to include a defective portion is recognized by the determination section 2 as a defective contour plot. Correction parameters applied in lithography verification may be a numerical aperture NA, a lithography exposure condition, a light intensity parameter such as distortion, an etching correction parameter, and so forth. In defect determination of contour plots, a correction limit value for a width dimension of a contour plot may be used as a reference value.

Figure 3D:
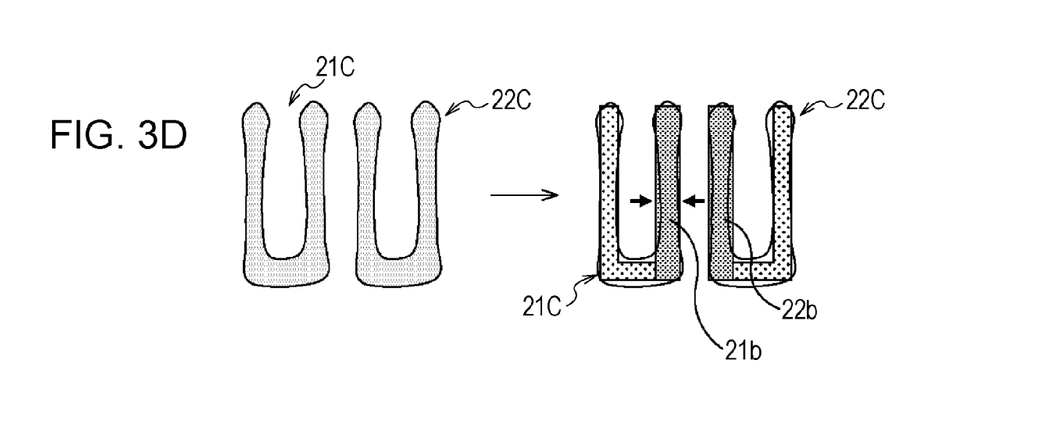

FIG. 3D illustrates, on the left, contour plots 21C and 22C created from the second correction data 21B and 22B, respectively, and, on the right, defective portions 21b and 22b included in the contour plots 21C and 22C, respectively. The defective portion 21b and the defective portion 22b are different, and thus the defective contour plot 21C and the defective contour plot 22C have different shapes.

The classifying section 3 extracts reference patterns of original layout patterns corresponding to defective contour plots at Step S4 and classifies the defective contour plots into categories of the reference patterns at Step S5.

Prior to the description of processing of S3 and S4, classifying of classifying target patterns, e.g., defective contour plots having defective portions in accordance with a comparative example of the present embodiment, will be described.

Figure 4A:
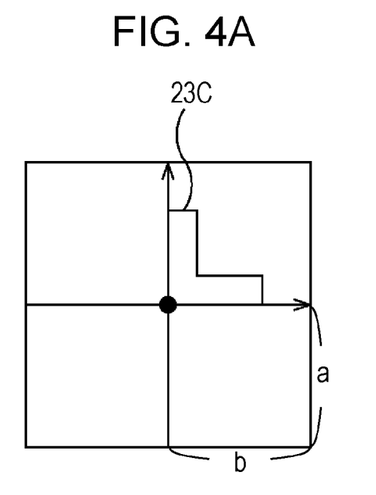
FIGS. 4A to 4D are schematic views illustrating corresponding patterns.

In the comparative example as illustrated in FIG. 4A for example, data corresponding to a specific region centered on a certain origin is cut out. Then, defective contour plots determined to have shapes matching the contour plot 23C are collected. The data region to be cut out may be a region defined by distances a and b of approximately 150 μm, for example, from the origin of the contour plot 23C. In this case, as described above, contour plots having different shapes of defective portions are determined to be different defective contour plots and thus classified in different categories.

Even when defective contour plots have defective portions having a similar shape, these contour plots may be determined to be different defective contour plots, depending on the data region to be cut out.

Figure 4B:
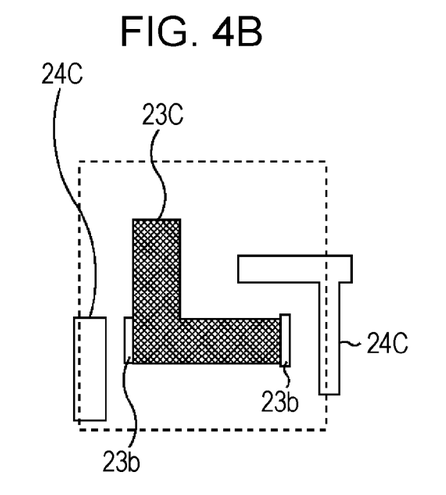
Figure 4C:
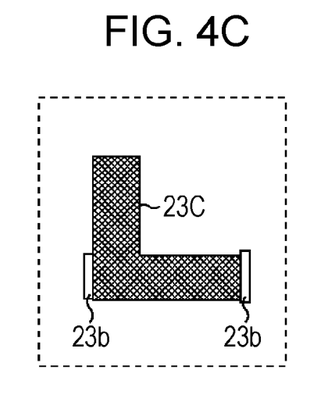

Referring to FIG. 4B, the data region indicated by a broken line includes the contour plot 23C having defective portions 23b and parts of neighboring contour plots 24C. In FIG. 4C, the data region indicated by a broken line includes only the contour plot 23C having the defective portions 23b. In classifying according to the comparative example, features that are present within a data region are recognized. Thus, the contour plot 23C in FIG. 4B and the contour plot 23C in FIG. 4C, which are to be classifying target, are classified as being different defective contour plots even though both contour plots 23C are similar.

The above comparative example results in an undesired classifying ratio. The classifying ratio is a value based on the number of categories obtained as a result of classifying, and a lower value indicates a more desirable classifying result. In pattern verification for miniature and complex device patterns, it often happens that almost all defective contour plots are classified as being different and thus may not be verified in groups of common features. Consequently, considerable amounts of labor and time are required for pattern verification.

Figure 5A:
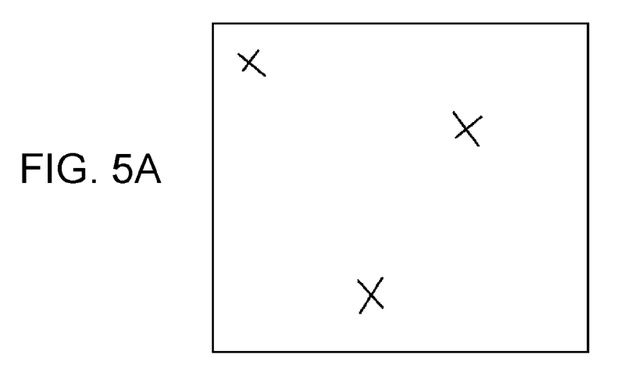
FIGS. 5A to 5D illustrate classifying according to an embodiment.

In the present embodiment, at Step S4, the reference pattern extraction unit 13 extracts a reference pattern of the original design patterns for the defective contour plot recognized by the determination section 2. The reference pattern extraction unit 13 outputs defective portions in the defective contour plots, as indicated by the "x" marks in FIG. 5A, and sets the coordinates of the defective contour plot portions in an image area such as a chip image.

Figure 5B:
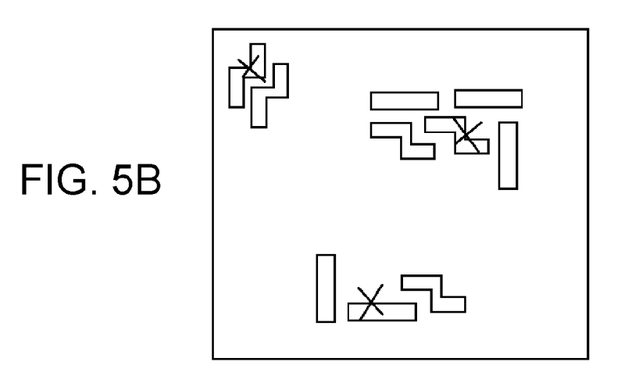

Based on the defective contour plots set as coordinates as illustrated in FIG. 5B, the reference pattern extraction unit 13 reads, from the design data storage section 10, reference patterns of the original design layout patterns corresponding to the defective contour plots. For example, the reference pattern extraction unit 13 reads cell information of a bottom cell. Cell information includes a cell name, coordinates, mirroring information, rotation information, offset information indicating relative positions of a cell origin and a defective portion, etc. In general, an original design pattern has a layered structure, and cell names are assigned in units of cells and macrostructures. Here, a bottom cell in original design data is used as a reference pattern. However, a cell in an upper layer may be used.

Figure 6A:
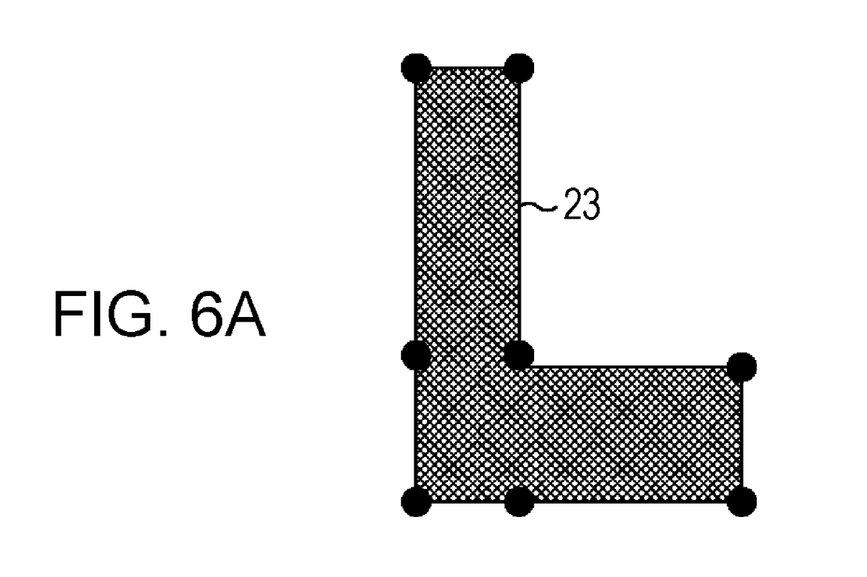
FIGS. 6A and 6B illustrate a technique for recognizing a cell of an original design pattern.
Figure 6B:
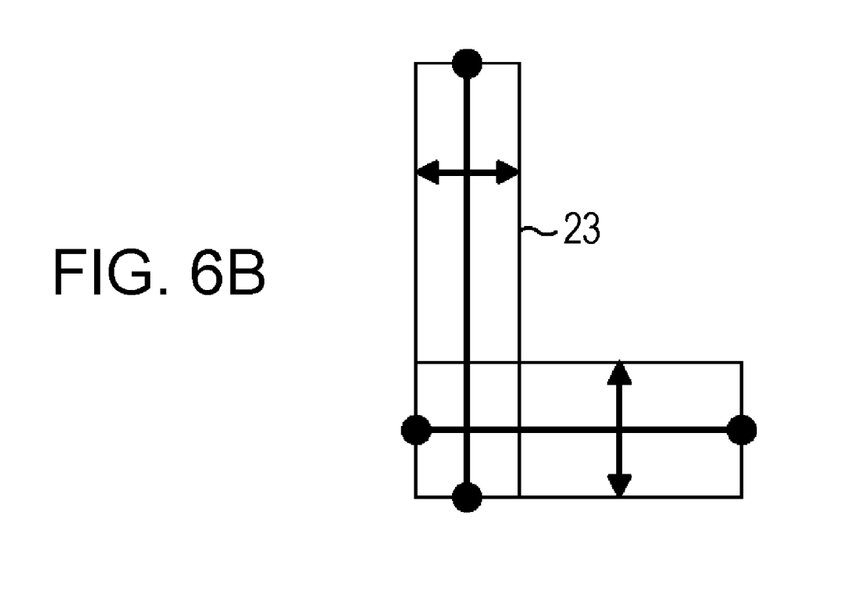

Instead of a cell name, the coordinates of individual portions of a reference pattern, or the length and width of individual portions of the reference pattern may be used as cell information. When coordinates are used as cell information, the coordinates of eight points on the outline of a reference pattern 23 are used, as illustrated in FIG. 6A. When the length and width are used, two lengths and two widths in the reference pattern 23 are used, as illustrated in FIG. 6B. The amount of information is relatively small when length and width are used as cell information.

FIGS. 7A to 7D illustrate examples original design patterns having different mirroring or rotation information and having the same reference pattern. The origin of an original design pattern 25 is indicated by x. In this example, counterclockwise rotation corresponds to a positive value. In each of the figures, original design patterns 26 arranged near the original design pattern 25, which is to be verified, are illustrated.

Figure 7A:
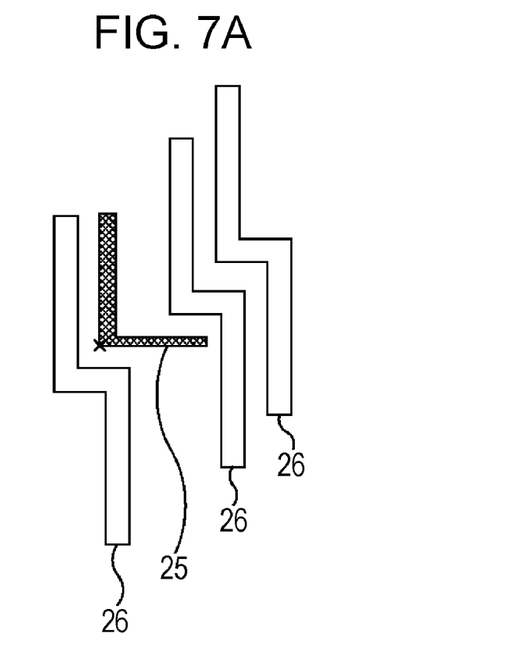
FIGS. 7A to 7D illustrate defective contour plots exhibiting different mirroring and rotation.
Figure 7B:
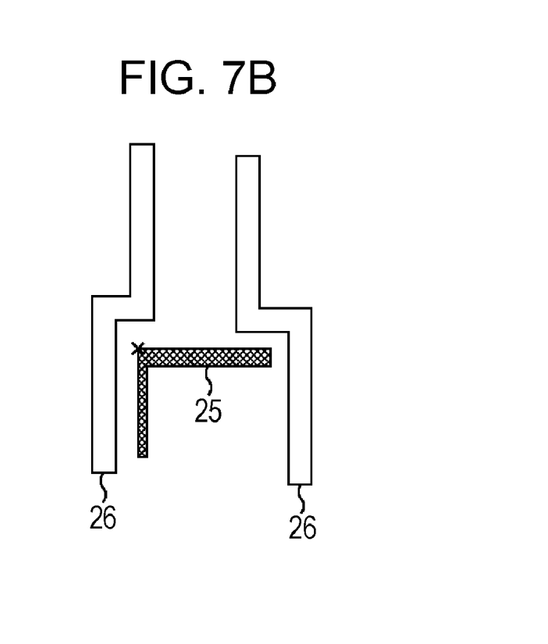
Figure 7C:
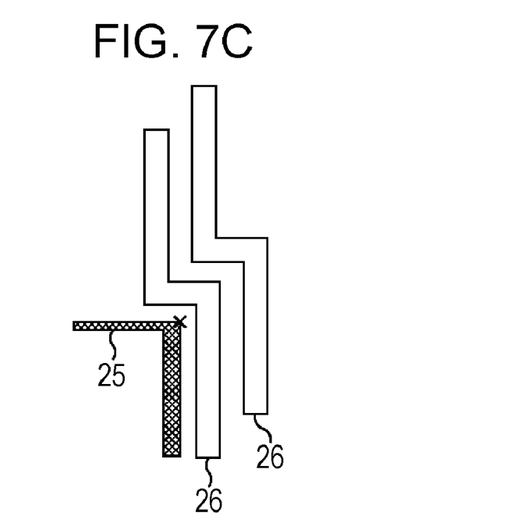
Figure 7D:
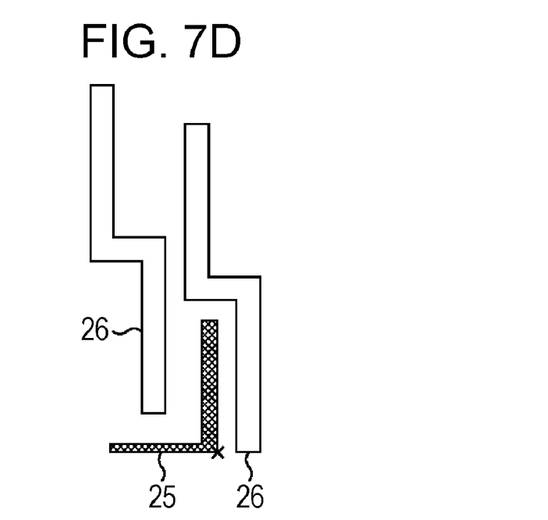

FIG. 7A illustrates the original design pattern 25 that is neither mirrored nor rotated. FIG. 7B illustrates the original design pattern 25 that is not mirrored and is rotated 270 degrees. FIG. 7C illustrates the original design pattern 25 that is not mirrored and is rotated 180 degrees. FIG. 7D illustrates the original design pattern 25 that is mirrored about the Y axis and is not rotated. By obtaining the above set of information regarding mirroring and rotation, it may be determined that all of the original design patterns 25 illustrated in FIGS. 7A to 7D have the same reference pattern.

At Step S5, the classifying unit 14 classifies defective contour plots into categories of the reference patterns which have been extracted.

Figure 5C:
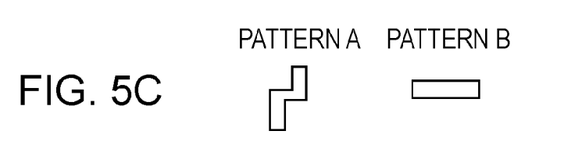
Figure 5D:
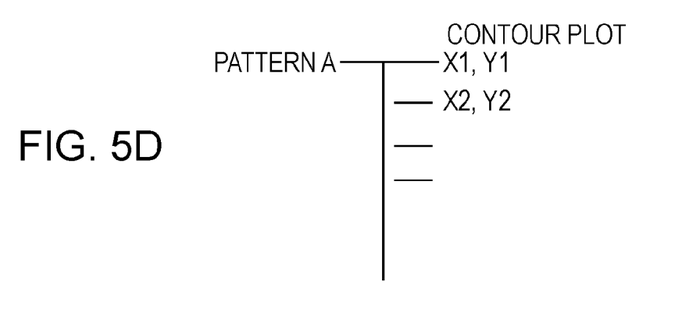

As illustrated in FIG. 5C, reference patterns extracted from the defective contour plots illustrated in FIG. 5B are set as patterns A and B. As illustrated in FIG. 5D, the classifying unit 14 organizes defective contour plots having the same reference pattern with, for example, plane coordinates, such as ((X1, Y1), (X2, Y2), . . . ).

Figure 4D:
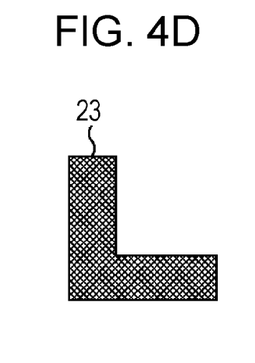
Figure 8A:
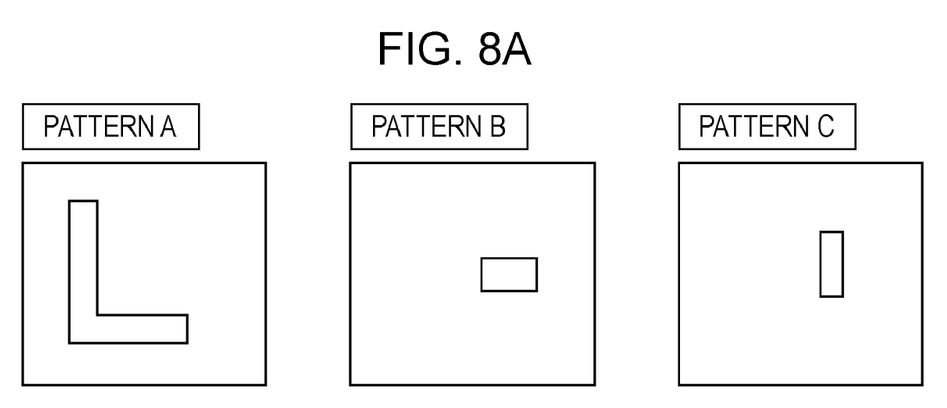
FIGS. 8A and 8B illustrate classifying according to an embodiment.
Figure 8B:
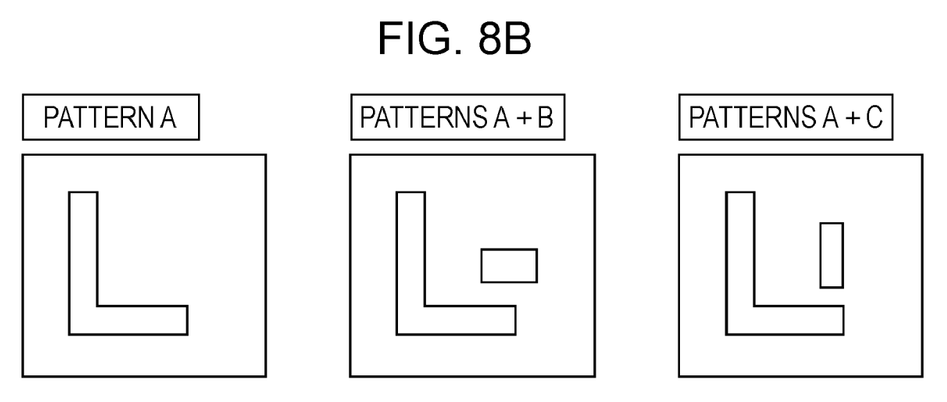

In the present embodiment, in Step S4 and Step S5 performed by the classifying section 3, defective contour plots are classified in accordance with patterns A, B, and C extracted from the defective contour plots, as illustrated in FIG. 8A for example. Thus, as illustrated in FIG. 8B for example, even when defective contour plots corresponding to the patterns B and C are present near a defective contour plot corresponding to the pattern A, each of the patterns A to C may be extracted, unlike the case of the comparative example described above. For comparison to FIGS. 4A to 4C illustrating the comparative example, FIG. 4D illustrates a reference pattern 23 corresponding to the contour plots 23C.

In this way, according to the present embodiment, defective contour plots are classified into categories of reference patterns. This may improve the classifying ratio and reduce the labor and time required for pattern verification.

At Step S6, the superposition unit 15 superposes defective contour plots on the corresponding reference pattern so that an origin defined at a certain portion on the reference pattern and the corresponding point on the defective contour plots coincide.

Figure 9A:
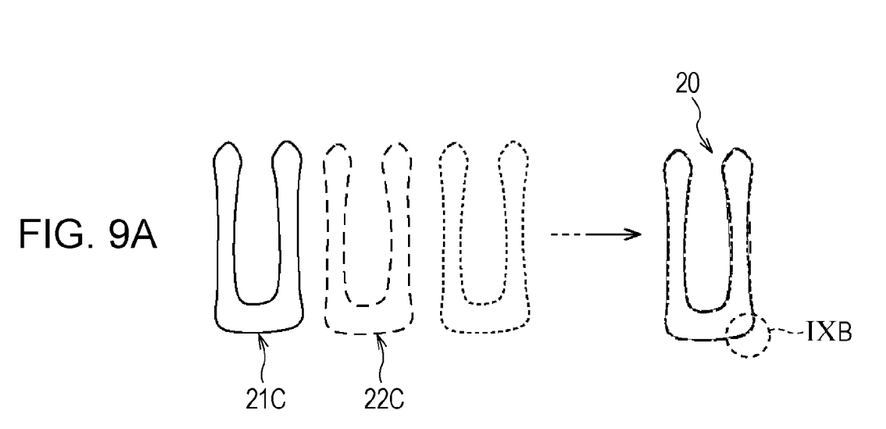
FIGS. 9A and 9B illustrate superposition verification of defective contour plots according to an embodiment.

FIG. 9A illustrates superposition of defective contour plots 21C, 22C, and so forth on a corresponding reference pattern serving as a determination criterion.

In the above superposition, the defective contour plots are superposed on the reference pattern at the origin of the reference pattern. In addition or instead of the above arrangement, it is also possible that the defective contour plots are superposed at individual defective portions of the defective contour plots. Further, it is also possible that the defective contour plots are superposed at midpoints of individual portions having the smallest widths in the defective contour plots.

At Step S7, the defect verification unit 16 determines whether or not each of the superposed defective contour plots is acceptable based on the allowable range defined based on the corresponding reference pattern.

Figure 9B:
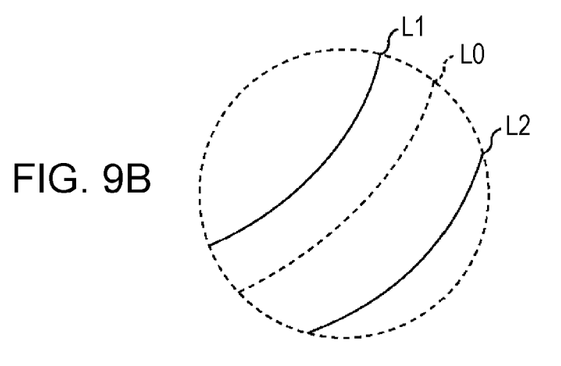

As illustrated in FIG. 9B, which is an enlarged view of a portion enclosed by a circle IXB in FIG. 9A, a pair of reference lines L1 and L2 are defined with respect to a contour line L0 of the reference pattern as the center. The defect verification unit 16 determines whether or not the contour line L0 of each of the defective contour plots falls within an allowable range defined by the reference lines L1 and L2, thereby determining the acceptability or unacceptability of each defective contour plot. The reference lines L1 and L2 do not necessarily have the same distance from the contour line L0 of the reference pattern and may be defined so that either of the lines L1 and L2 is closer to or farther from the contour line L0. In the example illustrated in FIG. 9B, the reference lines L1 and L2 are defined so that the reference line L1 is closer to the contour line L0 than the reference line L2.

At step S7, if checking focuses on a defect in a device pattern such as partial disconnection, e.g., necking, and/or partial adhesion, e.g., bridging, the defect verification unit 16 calculates a difference between superposed defective contour plots. The difference between defective contour plots is considered as the difference of the outlines of contrasting defective contour plots. When necking is focused upon, the defective contour plots having small values are checked. When bridging is focused upon, the defective contour plots having large values are checked.

In the pattern verification method according to the present embodiment, in Step S7, if, among the defective contour plots, there is a defective contour plot whose outline falls beyond the allowable range defined by the reference lines L1 and L2, the following operations are performed.

The coordinates of the defective contour plot and information on a defective portion may be obtained based on the information obtained as a result of the procedures from Step S5 to Step S7. Using the information, the pattern verification apparatus calculates an inverse transform value for revising based on the relation between the defective portion of the defective contour plot and the corresponding reference pattern. Then, for example, the pattern verification apparatus feeds back the calculation result to the pre-biasing processing of Step S1 and the OPC processing of Step S2, and the like.

Based on design data, in which defective contour plots corresponding to individual reference patterns are verified and determined to be acceptable, actual device patterns are formed.

For example, when device patterns are formed on a semiconductor substrate, or on resists on patterning target layers of a semiconductor substrate by photolithography, photomasks corresponding to the individual patterning target layers are formed based on the design data. Then, the resists are exposed through the mask patterns of the photomasks using a stepper, and processing such as development is performed. In this way, resists are processed and resist patterns are formed.

Using the resist patterns as masks, dry etching or wet etching, ion implantation, etc. are performed. Then, the resist patterns are removed by ashing or the like. In this way, device patterns including various gate electrodes, insulating components, wiring, which are formed by processing a semiconductor substrate, or an insulating film or a conductive film of a semiconductor substrate, are formed. Semiconductor devices, such as MIS (metal-insulator semiconductor) transistors, EEPROMs (electrically erasable programmable read-only memory), DRAMs (dynamic random-access memory), FeRAMs (ferroelectric random access memory), and bipolar transistors, are fabricated.

The technique according to the above embodiment may be applied not only to device patterning in which photomasks are fabricated by photolithography, but also to a case where a pattern of design data is directly projected onto a resist by using an electron beam exposure device.

The functions of the pattern verification apparatus according to the embodiment described above, including, for example, the correction section 1, the determination section 2, the classifying section 3, and the superposition determination section 4, may be realized by executing software SWA and software SWB. The software SWA and the software SWB are programs stored in the RAM and ROM, for example, in a computer PC. In this example, the software SWA corresponds to the correction section 1, and the software SWB corresponds to the determination section 2, the classifying section 3, and the superposition determination section 4.

Similarly, the individual steps of processing of the pattern verification method, such as the processing of Step S1 to Step S7, may be realized by executing, for example, the software SWA and SWB stored as programs in the RAM and the ROM of the computer PC illustrated in FIG. 2. The programs and a computer-readable storage medium storing the programs are included in the present embodiment.

The programs may be supplied to a computer through a storage medium such as a CD-ROM (compact disk-read-only memory) storing the programs or through various transmission media. Examples of a storage medium other than a CD-ROM include a flexible disk, a hard disk, a magnetic tape, a magneto-optical disk, and a non-volatile memory card. For transmission of the programs, a communication medium in a computer network system for transmitting program information on a carrier wave may be used. The computer network may be, for example, a LAN (local area network), a WAN (wide area network) such as the Internet, and/or a wireless communication network. The communication medium may be, for example, a wired line such as an optical fiber and/or a wireless line.

Programs included in the present embodiment are not only those which realize the functions of the above embodiment when being executed by computers. For example, a program that realizes the functions of the above embodiment in cooperation with an operating system (OS) or other application software running on the computer is also included in the present embodiment. Further, it is also possible that a function expansion board or a function expansion unit of a computer executes part or all of processing of a supplied program so that functions of the above embodiments may be realized, and the program is also included in the present embodiment.

Figure 10:
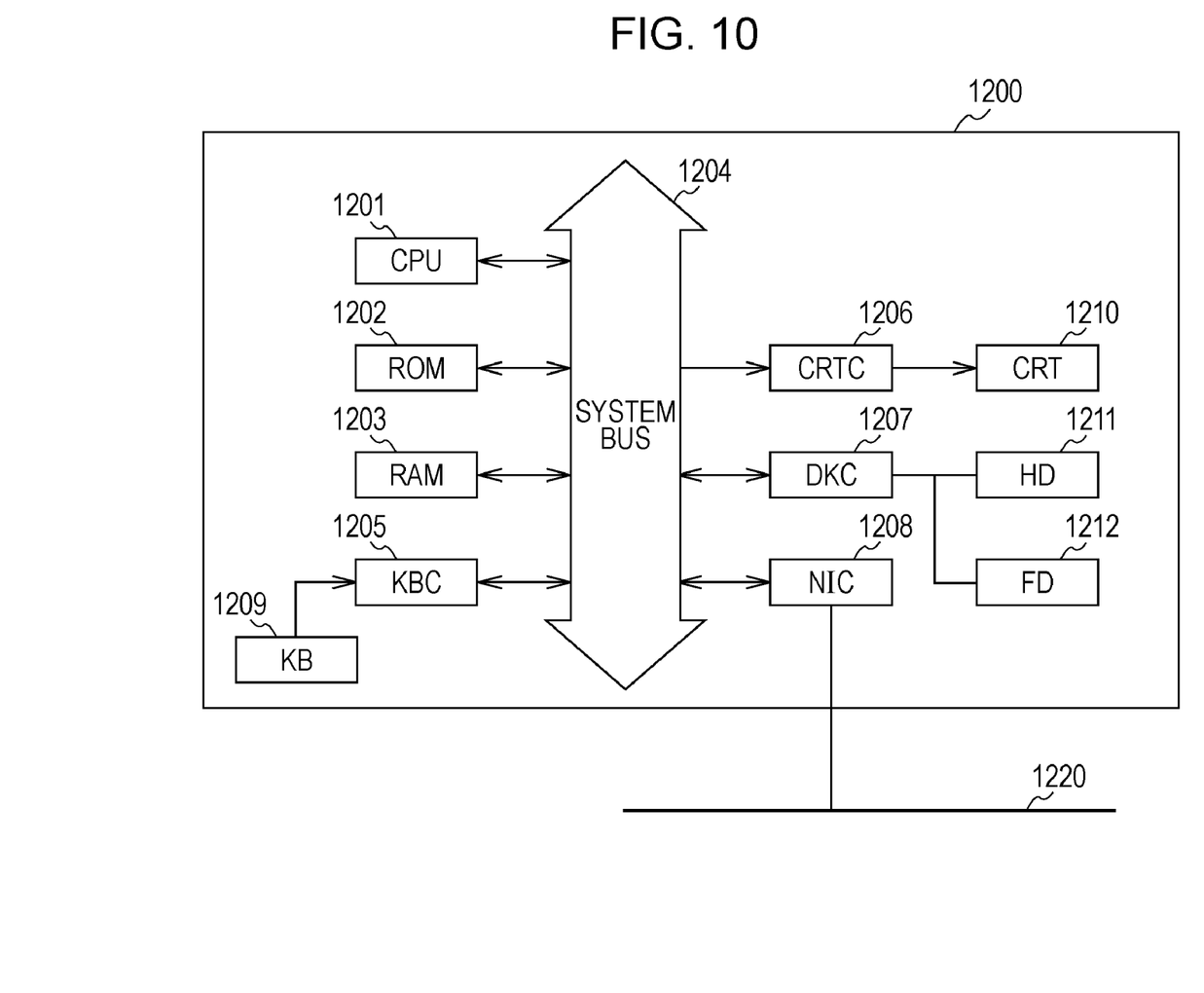
FIG. 10 illustrates an internal configuration of a computer illustrated in FIG. 2.

For example, an internal configuration of the computer illustrated in FIG. 2 is schematically illustrated in FIG. 10. A personal computer (PC) 1200 has a CPU (central processing unit) 1201 and executes device control software which is stored in a ROM 1202 or a hard disk (HD) 1211 or supplied from a flexible disk drive (FD) 1212. The PC 1200 centrally controls individual devices connected to a system bus 1204.

The procedures of Step S1 to Step S7 according to the present embodiment illustrated in FIG. 2 may be realized by the CPU 1201 of the PC 1200 and programs stored in a ROM 1202 or the hard disk 1211, such as the software SWA and SWB illustrated in FIG. 2.

The PC 1200 may also include a RAM (random access memory) 1203, a keyboard controller (KBC) 1205, a CRT (cathode-ray tube) controller (CRTC) 1206, a disk controller (DKC) 1207, and a network interface card (NIC) 1208. The RAM 1203 serves as a main memory, a work area, and the like of the CPU 1201. The KBC 1205 controls a keyboard (KB) 1209 and an instruction input from a device (not illustrated) or the like.

The CRTC 1206 controls display of a CRT display (CRT) 1210. The DKC 1207 controls access to the hard disk (HD) 1211 and the flexible disk (FD) 1212 storing a boot program, various applications, an edit file, a user file, a network management program, and the like. The boot program refers to an activation program for initiating the execution of hardware and software of a personal computer.

The network interface card (NIC) 1208 sends and receives data to and from a network printer, a network device, another PC, and the like via a LAN 1220.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A pattern verification apparatus comprising:
    a correction section configured to correct a plurality of original design patterns to create a plurality of first data pieces;
    a determination section configured to perform light intensity simulation to create a plurality of simulation result plots, determine whether or not each of the plurality of simulation result plots falls within an allowable range, and recognize, among the plurality of simulation result plots, two or more simulation result plots that do not fall within the allowable range as a plurality of second data pieces;
    an extraction section configured to extract a reference pattern of the plurality of original design patterns corresponding to the plurality of second data pieces; and
    a classifying section configured to sort the plurality of second data pieces into categories of the reference pattern.

2. The pattern verification apparatus of claim 1, further comprising a superposition determination section configured to superpose the plurality of second data pieces classified into the same category and determine whether or not each of the plurality of classified second data pieces is desirable.

3. The pattern verification apparatus of claim 2,
    wherein the superposition determination section performs the determination by comparing the plurality of superposed second data pieces to the allowable range defined based on the reference pattern corresponding to the plurality of second data pieces.

4. The pattern verification apparatus of claim 2,
    wherein the superposition determination section performs the determination based on a difference between the plurality of superposed second data pieces.

5. The pattern verification apparatus of claim 2,
    wherein the extraction unit extracts the reference pattern corresponding to the plurality of second data pieces based on any one of a name of the reference pattern, a coordinate of an individual portion of the reference pattern, and a length and width of an individual portion of the reference pattern.

6. The pattern verification apparatus of claim 2,
    wherein the correction section creates the plurality of first data pieces by performing optical proximity correction on the plurality of original design patterns.

7. The pattern verification apparatus of claim 6,
    wherein the correction section creates the plurality of first data pieces by revising results of the optical proximity correction after performing the optical proximity correction.

8. A computer-readable storage medium storing a program, the program causing a computer to execute:
    correcting a plurality of original design patterns to create a plurality of first data pieces;
    performing light intensity simulation on the plurality of first data pieces to create a plurality of simulation result plots;
    determining whether or not each of the plurality of simulation result plots falls within an allowable range and recognizing, among the plurality of simulation result plots, two or more simulation result plots that do not fall within the allowable range, as a plurality of second data pieces;
    extracting a reference pattern of the plurality of original design patterns corresponding to the plurality of second data pieces; and
    classifying the plurality of second data pieces into categories of the reference pattern.

9. The storage medium of claim 8,
    wherein the program causes a computer to further execute superposing the plurality of second data pieces which have been classified into the same category, and execute determining whether or not each of the plurality of classified second data pieces is desirable.

10. The storage medium of claim 9,
    wherein the program uses the allowable range as a determination criterion when determining the desirability or undesirability of each of the second data pieces, the allowable range being defined based on the reference pattern corresponding to the second data pieces.

11. The storage medium of claim 9,
    wherein the program determines the desirability or undesirability of each of the plurality of superposed second data pieces based on a difference between the plurality of superposed second data pieces.

12. The storage medium of claim 8,
    wherein the program extracts the reference pattern corresponding to the plurality of second data pieces based on any one of a name of the reference pattern, a coordinate of an individual portion of the reference pattern, and a length and width of an individual portion of the reference pattern.

13. A pattern verification method executed by a computer, the method comprising:
    correcting a plurality of original design patterns to create a plurality of first data pieces;

performing light intensity simulation on the plurality of first data pieces to create a plurality of simulation result plots;

determining whether or not each of the plurality of simulation result plots falls within an allowable range, and recognizing, among the plurality of simulation result plots, two or more simulation result plots that do not fall within the allowable range as a plurality of second data pieces;

extracting a reference pattern of the plurality of original design patterns corresponding to the plurality of second data pieces; and classifying the plurality of second data pieces into categories of the reference pattern.

14. The pattern verification method of claim 13, further comprising superposing the plurality of second data pieces classified into the same category and determining whether or not each of the plurality of classified second data pieces is desirable.

15. The pattern verification method of claim 14,
wherein the desirability or undesirability of each of the second data pieces is determined by using the allowable range as a determination criterion, the allowable range being defined according to the reference pattern corresponding to the second data pieces.

16. The pattern verification method of claim 14,
wherein the desirability or undesirability of each of the second data pieces is determined based on a difference between the plurality of superposed second data pieces.

17. The pattern verification method of claim 13,
wherein the reference pattern corresponding to the plurality of second data pieces is extracted based on any one of a name of the reference pattern, a coordinate of an individual portion of the reference pattern, and a length and width of an individual portion of the reference pattern.

18. The pattern verification method of claim 14,
wherein the plurality of first data pieces are created by performing optical proximity correction on the plurality of original design patterns.

19. The pattern verification method of claim 18,
wherein the plurality of first data pieces are created by revising the optical proximity correction after performing the optical proximity correction.

* * * * *